United States Patent [19]

Neal et al.

[11] Patent Number: 5,483,102

[45] Date of Patent: Jan. 9, 1996

[54] EMPLOYING ON DIE TEMPERATURE SENSORS AND FAN-HEATSINK FAILURE SIGNALS TO CONTROL POWER DISSIPATION

[75] Inventors: James R. Neal, Cameron Park; Peter F. Brown, Orangevale; Louis W. Agatstein, El Dorado Hills, all of Calif.; Michael Gutman, Zichron-Ya'ácov, Israel

[73] Assignee: Intel Corporation, Santa Clara, Calif.

[21] Appl. No.: 241,777

[22] Filed: May 12, 1994

[51] Int. Cl.⁶ .................................................. G06F 15/20
[52] U.S. Cl. ...................... 257/712; 257/706; 257/713; 395/550; 395/750; 361/98; 361/103; 361/106; 364/557
[58] Field of Search ............... 365/230.02; 395/400, 395/550, 750; 62/6; 257/706, 713; 361/98, 103, 106; 364/557

[56] References Cited

U.S. PATENT DOCUMENTS 5,287,292  2/1994  Kenny et al. ........................... 395/550
5,349,823  9/1994  Solomon ..................................... 62/6

OTHER PUBLICATIONS

Paul Horowitz & Winfield Hill, *Art of Electonics*, 1989, P335–P339.

Primary Examiner—Viet Q. Nguyen
Attorney, Agent, or Firm—Blakely, Sokoloff, Taylor & Zafman

[57] ABSTRACT

A circuit and method for reducing an internal clocking frequency of the semiconductor device upon receiving a first signal indicating that a fan element disposed on the semiconductor device is operating at an unacceptable performance level and/or a second signal indicating that the semiconductor device is operating at a temperature greater than a prescribed boundary temperature.

22 Claims, 6 Drawing Sheets

EMPLOYING ON DIE TEMPERATURE SENSORS AND FAN-HEATSINK FAILURE SIGNALS TO CONTROL POWER DISSIPATION

BACKGROUND OF THE INVENTION

1. Field of the Invention

The present invention relates to the field of thermal management of semiconductor devices. More particularly, this invention relates to a circuit and method for reducing an internal clocking frequency of the semiconductor device upon receiving a first signal indicating fan failure and/or a second signal indicating thermal overload.

2. Background of the Invention

It is common knowledge that most semiconductor devices, as shown in FIG. 1, comprise an integrated circuit as a die 2 encapsulated within a cavity 3 of a package 4 such as a Pin Grid Array ("PGA") package. This package 4 is usually made of ceramic and performs numerous functions including but not limited to protecting the integrated circuit from damage, dissipating heat from the integrated circuit during operation, and providing electrical communications between the semiconductor device and other semiconductor devices. To establish electrical communication with other semiconductor devices employed within a system, a plurality of wire leads 5 are coupled to the die 2 and correspondingly coupled to a plurality of connector pins 6. These plurality of connector pins 6 make electrical and mechanical contact with a plurality of bus lines within a printed circuit board 7 (e.g., a peripheral card, motherboard, etc.) generally incorporated within a computer system.

During operation, the die 2 consumes power at a rate correlated to its internal clocking frequency and generates heat as a by-product. Generally, heat is dissipated from the heat conductive die 2 adhesively attached to the package 4. Thereafter, the package 4 dissipates the heat to its surrounding atmosphere 8. For low-power semiconductor devices, the package 4 alone is typically sufficient to dissipate the heat.

Many semiconductor devices, especially microprocessors, operate at an internal clock frequency substantially greater than a system bus clock frequency of a computer system in order to allow the semiconductor device 1 to perform at its fastest possible frequency while allowing data exchange between the semiconductor device 1 and the printed circuit board 7 to proceed at the lesser system bus clock frequency. A dynamic feedback loop, including but not limited to a phase locked-loop ("PLL"), enables multiple derivatives of the system bus clock. Although a higher internal clock frequency enables better chip performance, it also increases thermal dissipation requirements so that the package 4 alone is usually incapable of providing adequate thermal dissipation, requiring at least a conventional thermal transfer device such as a heatsink 9a with optionally a heat slug 9b to be coupled into a bottom portion 4a of the package 4 proximate to the die 2 as shown in FIG. 2.

Following this line of reasoning, some current generation and most next generation semiconductor devices will consume more power than any prior semiconductor devices such that the heatsink 9a and/or heat slug 9b may not provide adequate thermal dissipation. Thus, an additional thermal transfer device (e.g., a fan) 10 is usually coupled to the heatsink 9a to provide a high level of airflow as shown in FIG. 3. However, reliance on the operation of the fan for cooling the semiconductor device offers many disadvantages.

One primary disadvantage is that the reliability of the semiconductor device is now also based on the reliability of the fan due to the fact that if the fan becomes inoperative (i.e., fan failure), so does the semiconductor device. This poses a problem especially when the fan is inherently less reliable than the semiconductor device, thereby lessening the reliability of the semiconductor device.

Another disadvantage is that using the fan without any monitoring mechanism exposes the semiconductor device to potential damage from excessive die temperature ("thermal overload"). Such thermal overload is likely if the fan element becomes inoperable or its performance falls below a certain level.

Hence, it would be desirable to provide a circuit and method for modifying the operation speed of the semiconductor device, which is directly related to power consumption, upon detection of a fan failure and/or thermal overload conditions. Although such modification of this operation speed would cause a temporary loss in performance of the semiconductor device, it would prevent total loss of functionality if the semiconductor device becomes damaged.

SUMMARY OF THE INVENTION

In view of the foregoing disadvantages, it is apparent that there exists a need for the above-mentioned circuit and corresponding method. Hence, it is an object of the present invention to provide a circuit and method for reducing the clocking frequency of the semiconductor device upon detection of certain fan failure and/or over temperature conditions.

It is another object of the present invention to monitor the fan element coupled to the semiconductor device and reduce the clocking frequency of the semiconductor device upon detecting a predetermined level of degradation of performance of the fan.

It is yet another object of the present invention to position a thermal sensor within the semiconductor device to detect whether an operational temperature of the semiconductor device is greater than a prescribed boundary temperature and reduce the clocking frequency in response thereto.

These and other objects of the present invention are provided by a circuit within a semiconductor device using a fan element in tandem with a heatsink to reduce an internal clocking frequency of the semiconductor device upon receipt of control signals indicating that the fan element has become inoperable or the die of the semiconductor device is operating at a temperature greater than the prescribed boundary temperature. This reduction in the clocking frequency, in turn, reduces power consumption of the semiconductor device so that less heat needs to be dissipated. This circuit comprises a multiple input logic gate wherein a first input signal line is coupled to a first input of the logic gate to indicate fan failure when fan performance falls below a predetermined level and a second input signal line is coupled to a second input of the logic gate to indicate that the die of the semiconductor device is operating at a temperature greater than a prescribed boundary temperature.

Upon activation by one of the input signal lines, or alternatively both of the input signal lines, an output signal of the logic gate will be activated. This output signal operates as a select line for an on-chip multiplexor having multiple clock inputs of varying clock frequencies in which one of the multiple clock inputs is selected as the internal clocking frequency of the semiconductor device. These multiple inputs include at least a system bus clock signal which is selected by the circuit if fan performance is below the predetermined level and/or a thermal sensor detects that the temperature of the die is greater than the prescribed boundary temperature, typically 100° C. to 150° C. Otherwise, as a default, a clock signal having a higher frequency is selected.

BRIEF DESCRIPTION OF THE DRAWINGS

The objects, features and advantages of the present invention will become apparent from the following detailed description of the present invention in which.

DETAILED DESCRIPTION OF THE PRESENT INVENTION

A circuit and method for reducing dock frequency for a particular semiconductor device having a fan element in combination with a heatsink in the event that the fan element experiences failure or unacceptable degradation in performance or is detected by a thermal sensor preferably within the semiconductor device that the semiconductor device is operating at a temperature greater than a prescribed boundary temperature. In the following description, for purposes of explanation, specific details are set forth in order to provide a thorough understanding of the present invention. However, it will be apparent to one skilled in the art of circuit design that the present invention may be practiced in any semiconductor device, especially processors, without these specific details. In other instances, well known operations, functions and devices are not shown in order to avoid obscuring the present invention.

Figure 1:
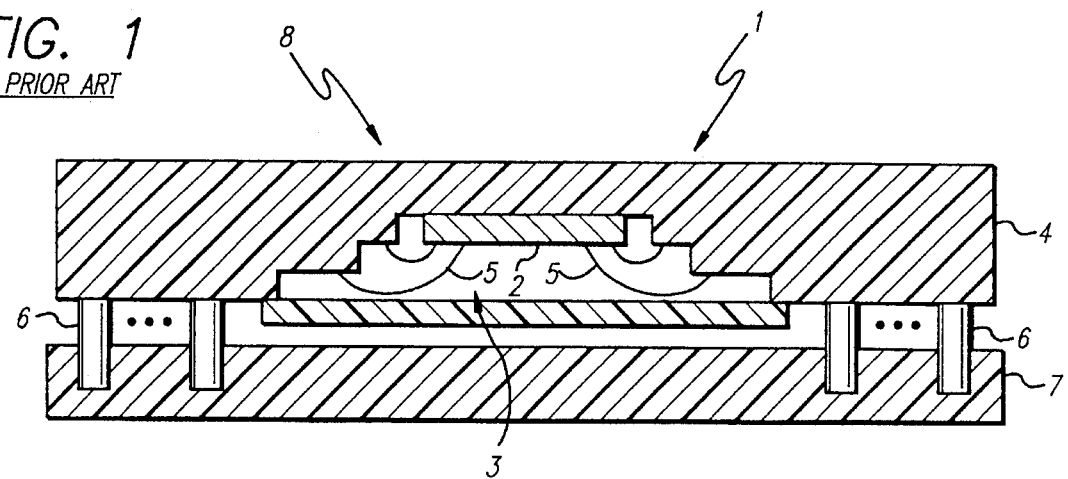
FIG. 1 illustrates a cross-sectional view of a conventional low-power semiconductor device having a PGA package.
Figure 2:
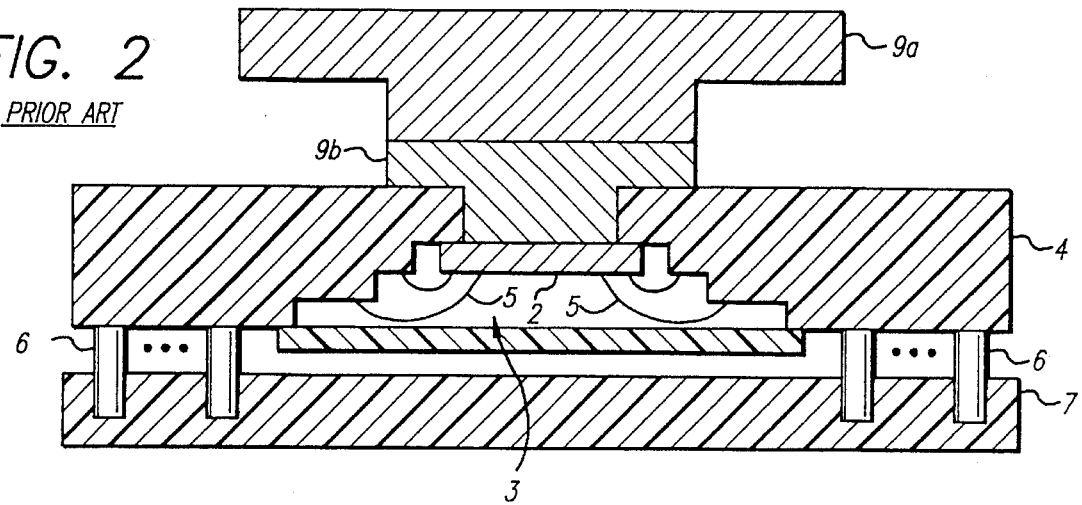
FIG. 2 is a cross-sectional view of a conventional semiconductor device having a heat-sink disposed on a bottom surface of the PGA package to provide additional thermal dissipation capabilities.
Figure 3:
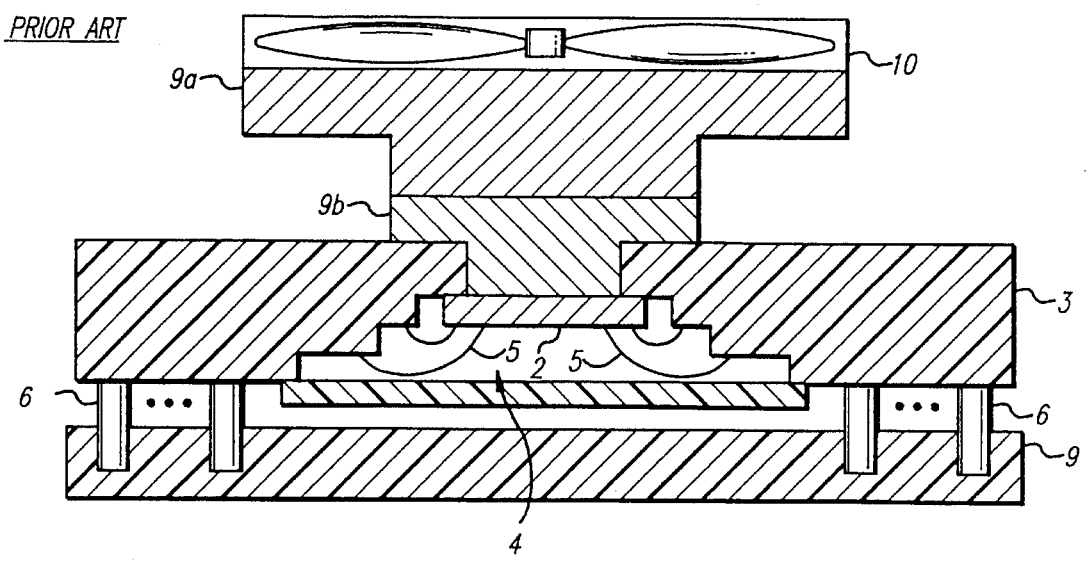
FIG. 3 is a cross-sectional view of a conventional semiconductor device having a fan/heatsink combination for thermal management.
Figure 4:
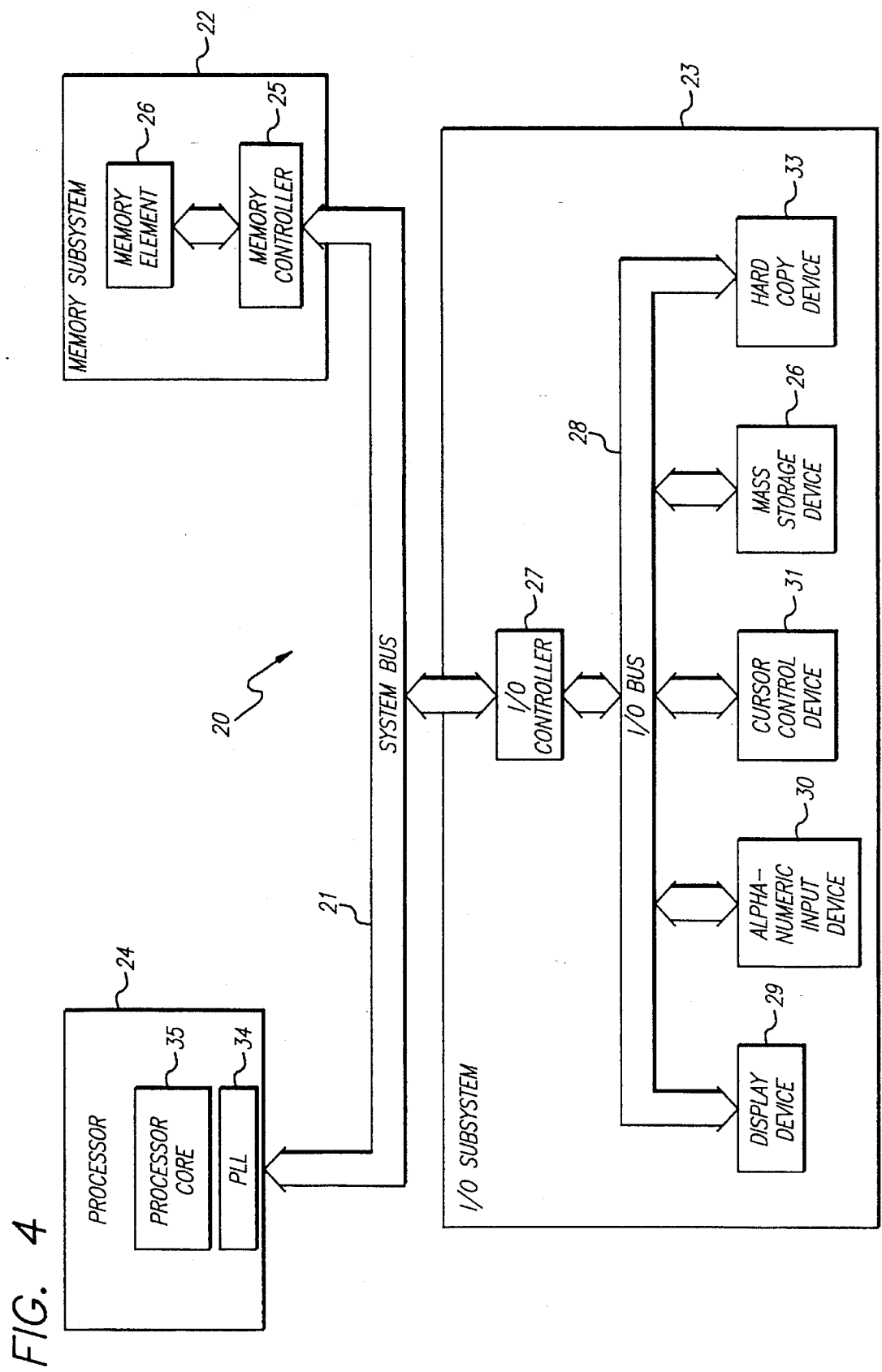
FIG. 4 is an embodiment of a computer system incorporating the present invention.

Referring to FIG. 4, an embodiment of a computer system 20 utilizing the present invention is illustrated. The computer system 20 generally comprises a system bus 21 includes address, data and control buses operating in cooperation with a system bus clock ("CLK") signal having a predetermined clocking frequency, normally thirty-three megahertz ("MHz"). The system bus 21 enables a plurality of agents, including a memory subsystem 22, an input/output ("I/O") subsystem 23 and a processor 24 to exchange and share information.

The memory subsystem 22 includes a memory controller 25 coupled to the system bus 21 to provide an interface for controlling access to at least one memory element 26 such as dynamic random access memory ("DRAM"), read only memory ("ROM"), video random access memory ("VRAM") and the like. The memory element 26 stores information and instructions for the processor 24.

The I/O subsystem 23 includes an I/O controller 27 being coupled to the system bus 21 and a conventional I/O bus 28. The I/O controller 27 is an interface between the I/O bus 28 and the system bus 21 which provides a communication path (i.e., gateway) for devices coupled to the system bus 21 to access or transfer information to devices coupled to the I/O bus 28 and vice versa. The I/O bus 28 communicates information between at least one peripheral device in the computer system 20 including, but not limited to a display device 29 (e.g., cathode ray tube, liquid crystal display, etc.) for displaying images; an alphanumeric input device 30 (e.g., an alphanumeric keyboard, etc.) for communicating information and command selections to the processor 24; a cursor control device 31 (e.g., a mouse, track ball, touch pad, etc.) for controlling cursor movement; a mass data storage device 32 (e.g., magnetic tapes, hard disk drive, floppy disk drive, etc.) for storing information and instructions; and a hard copy device 33 (e.g., plotter, printer, facsimile machine, etc.) for providing a tangible, visual representation of the information. It is contemplated that the computer system shown in FIG. 4 may employ some or all of these components or different components than those illustrated.

The processor 24, preferably an Intel® Architecture Processor, is further coupled to the system bus 21 in order to gain access to the memory subsystem 22 and an input/output ("I/O") subsystem 23 and obtain necessary clocking signals. In order to enhance its performance, the processor 24 normally includes a phase-locked loop ("PLL") 34 which receives the CLK signal as input and generates an internal clock ("ICLK") signal. The ICLK signal, being a function of the CLK signal, has a greater clocking frequency than the CLK signal and a constant duty cycle. The ICLK signal is routed to core circuitry of the processor 24 commonly referred to as a processor core 35 which processes requisite instruction sets.

Figure 5:
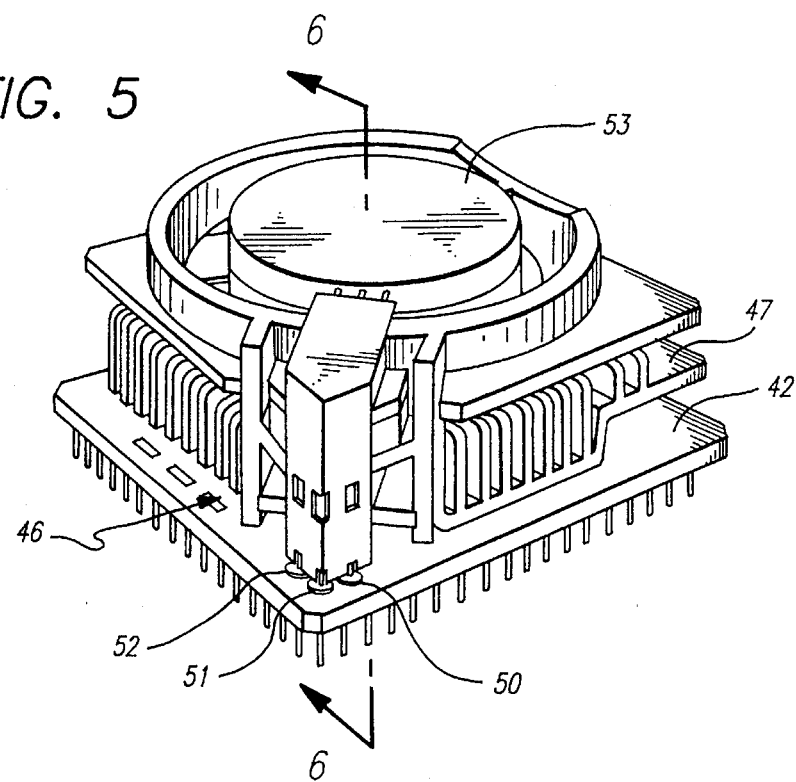
FIG. 5 is a perspective view of a semiconductor device utilizing the present invention.

Referring now to FIG. 5, the processor 24 includes a "fan/heatsink" 46 comprising a heatsink element 47, disposed on a bottom surface 42a of the package 42, and the fan element 48 disposed on the heatsink element 47 as shown. Three electrical connection pads 50, 51 and 52 are disposed on the bottom surface 42a of the package 42. A first and second electrical connection pads 50 and 51, associated with package pins 44a and 44b, provide power ("$V_{cc}$") and ground ("GND") signals to the fan element 48, particularly a device within a main fan casing 53 for rotating a propeller 49 (see FIG. 6). A third electrical connection pad 52 is coupled to a particular wire lead allowing the fan element 48 to output a FANFAIL signal to the die 40. The FANFAIL signal indicates that the fan element 48 is experiencing an unacceptable degradation in operation (e.g., a rotational speed of the propellor has decreased by a certain predetermined percentage from normal rotational speed).

Figure 6:
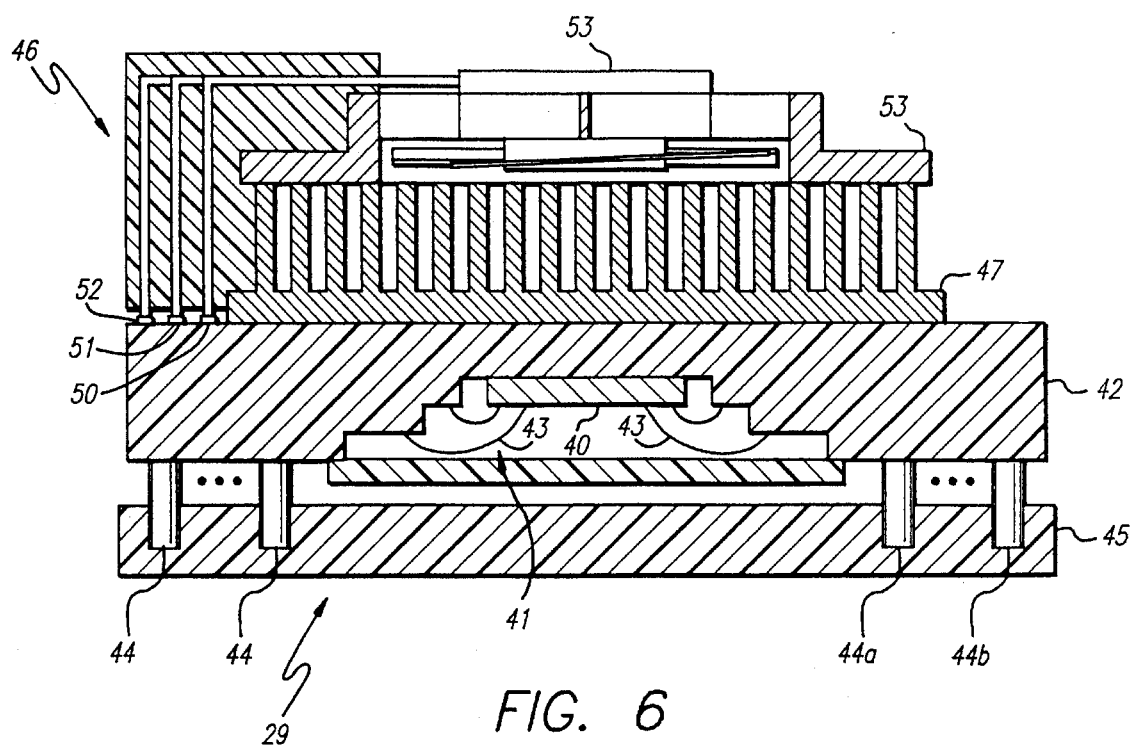
FIG. 6 is a cross-sectional view of a semiconductor device utilizing the present invention.

Referring to FIG. 6, a cross-sectional view of the processor 24 is illustrated. The processor 24 includes an integrated circuit in the form of a die 40 which is encapsulated, preferably hermetically, within a cavity 41 of a PGA package 42 (as shown) or any other conventional package such as, for example, a Ball Grid Array ("BGA") package, Land Grid Array ("LGA") package and the like. A plurality of wire leads 43 are coupled to at least the die 40 and a number of connector pins 44 which extend beyond the package 42. These connector pins 44 are attached typically by solder to bus lines throughout a printed circuit board 45. During operation of the die 40 (i.e., operation of the processor 24), the fan/heatsink 46 through rotational movement by the propeller 49 provides airflow to enhance the thermal dissipation capabilities of the heatsink element 47.

Figure 7:
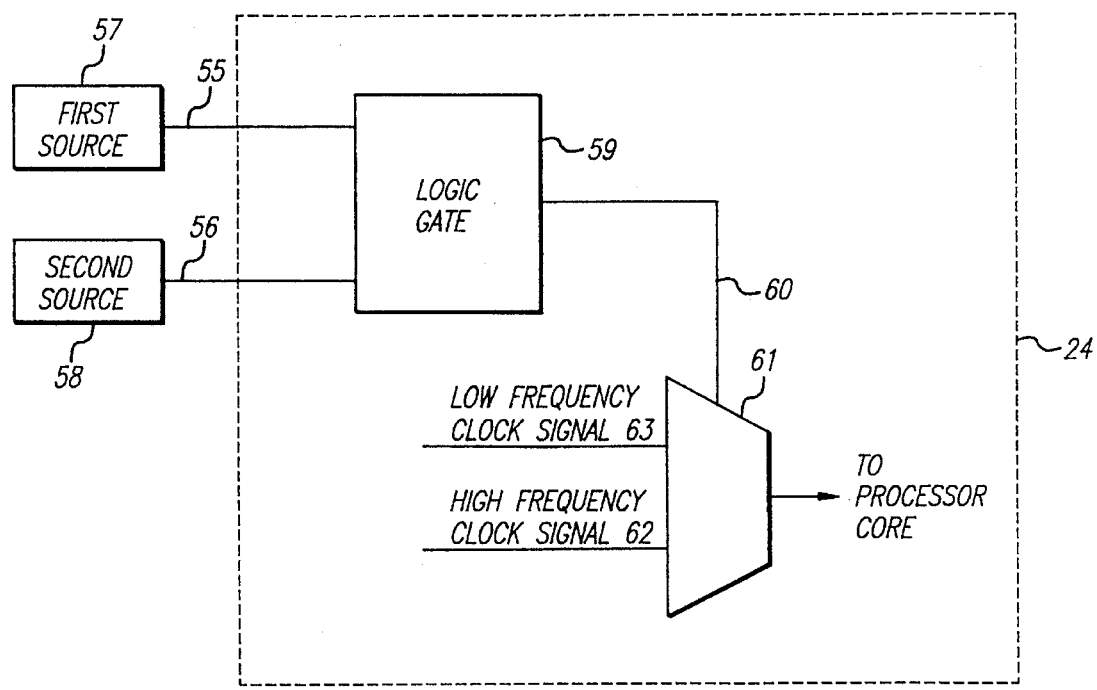
FIG. 7 is a circuit diagram of an embodiment of the present invention.

As illustrated in FIG. 7, one embodiment for reducing clocking frequency comprises a circuit including two input signal lines 55 and 56 having different sources external to the processor 24. A first source 57 of a first input signal line 55 is the fan element 48 which drives the FANFAIL signal through the first input signal line 55 upon detecting unacceptable degradation in its performance. For example, the FANFAIL signal may be activated when the fan element 48 detects that its production of airflow has decreased by a certain percentage.

It is contemplated that there exists many alternatives for detecting a decrease in production of airflow by the fan element. For example, fans for cooling semiconductor devices commonly employ a chip set to generate a motor pulse at a given frequency to drive a fan motor. By altering the frequency of the motor pulse, the fan element 48 is driven at various speeds thereby increasing or decreasing its airflow production. By implementing another control chip that generates a control pulse having a certain constant frequency which would provide inadequate air flow for proper thermal dissipation and comparing the frequencies of the motor pulse and the control pulse, the fan element 48 needs to merely detect when the motor pulse has a frequency less than the control pulse frequency. In such case, the fan element 48 activates the FANFAIL signal.

A second source 58 of a second input signal line 56 is a thermal sensor 58 which is an integrated circuit positioned proximate to the die or preferably on the die 40 to monitor its temperature. The thermal sensor 58 drives a THERMAL_OVERLOAD signal through the second input signal line 56 upon detecting that the processor 24 is operating at a temperature greater than a prescribed boundary temperature.

Figure 8:
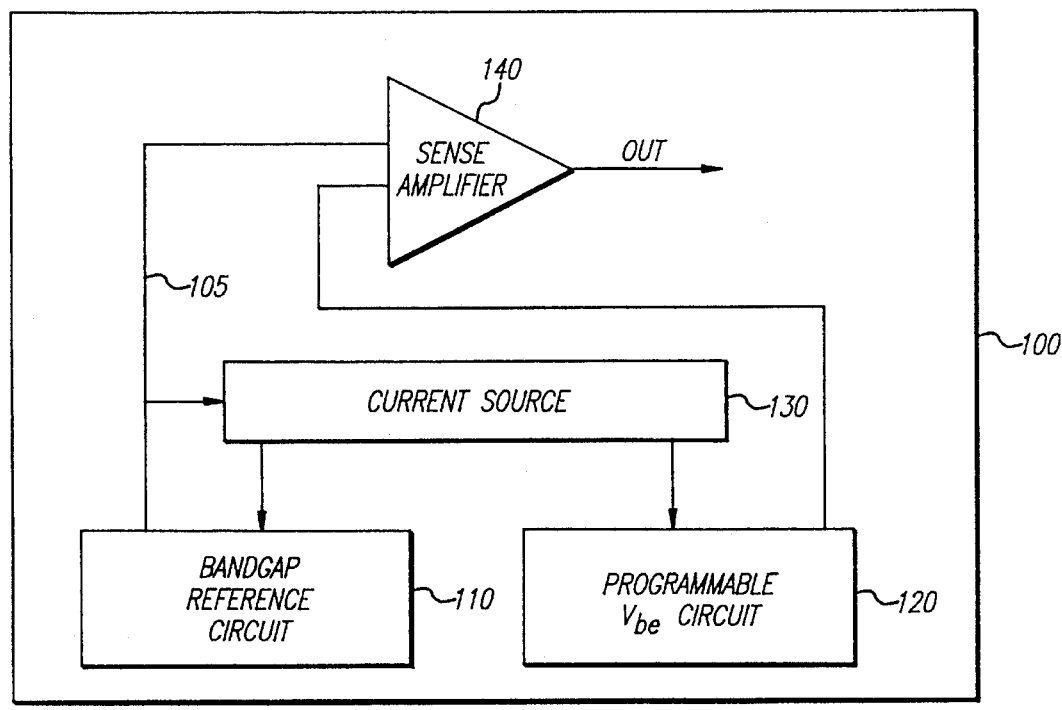
FIG. 8 is a block diagram of an embodiment of the thermal sensor positioned within the semiconductor device utilizing the present invention.

In order to detect whether the processor is operating at a temperature greater than the predetermined boundary temperature, the thermal sensor 58 monitors temperature dependent voltages. For illustrative purposes, a chosen thermal sensor is discussed; however, it is contemplated that any conventional thermal sensor may be used with the present invention. As shown in FIG. 8, the thermal sensor 58 (100) comprises a conventional bandgap reference circuit 110, a programmable base-emitter voltage ("$V_{be}$") circuit 120, a constant current source 130 and a sense amplifier 140. The sensor amplifier 140 transmits an active signal along the second input signal line 56 if a base-emitter voltage ("$V_{be}$"), a temperature dependent voltage provided by the programmable $V_{be}$ circuit 120 via a first input line 77, is greater than a reference voltage ("$V_{out}$") provided by the bandgap reference circuit 110 via a second input line 78. The reference voltage ("$V_{out}$") is set at a voltage equal to $V_{be}$ at the prescribed boundary temperature.

Generally, in the thermal sensor 58, the $V_{be}$ of a transistor is temperature dependent (i.e., a change in temperature causes a change in the $V_{be}$). The $V_{be}$ is compared to Vout generated by the bandgap reference circuit 110 which is not changing over temperature. If $V_{be}>V_{out}$, then the THERMAL_OVERLOAD signal is activated. Otherwise, the THERMAL_OVERLOAD signal remains inactive.

Referring to FIG. 8, the bandgap reference circuit 100 provides a stable voltage that is temperature independent to a first input of a dual-input sense amplifier 140 and biases the constant current source 130.

The bandgap reference circuit 110 must not only be stable over $V_{cc}$ and temperature, it must also be stable over process variation. Thus, only resistor ratios should be used and all transistors within the bandgap reference circuit 110 should be oriented in a same direction so that they will track each other. A pair of transistors 111 and 112 and resistors 116 and 115 forming a current mirror operate at different current densities. This produces a temperature dependent voltage across a first resistor 113. A third transistor 114 controls $V_{out}$ from the bandgap reference circuit 110 by sensing $V_{out}$ through the resistor 115. As a result, the third transistor 114 drives $V_{out}$ to a voltage being a sum of a base-emitter voltage ("$V_{be}$") of the third transistor 114 and a voltage drop across the resistor 115. When $V_{out}$ is set near a known bandgap voltage of silicon (approximately 1.12 volts), the voltage drop across the resistor 115 will compensate a temperature coefficient of $V_{be}$ so that $V_{out}$ becomes temperature independent.

Figure 9:
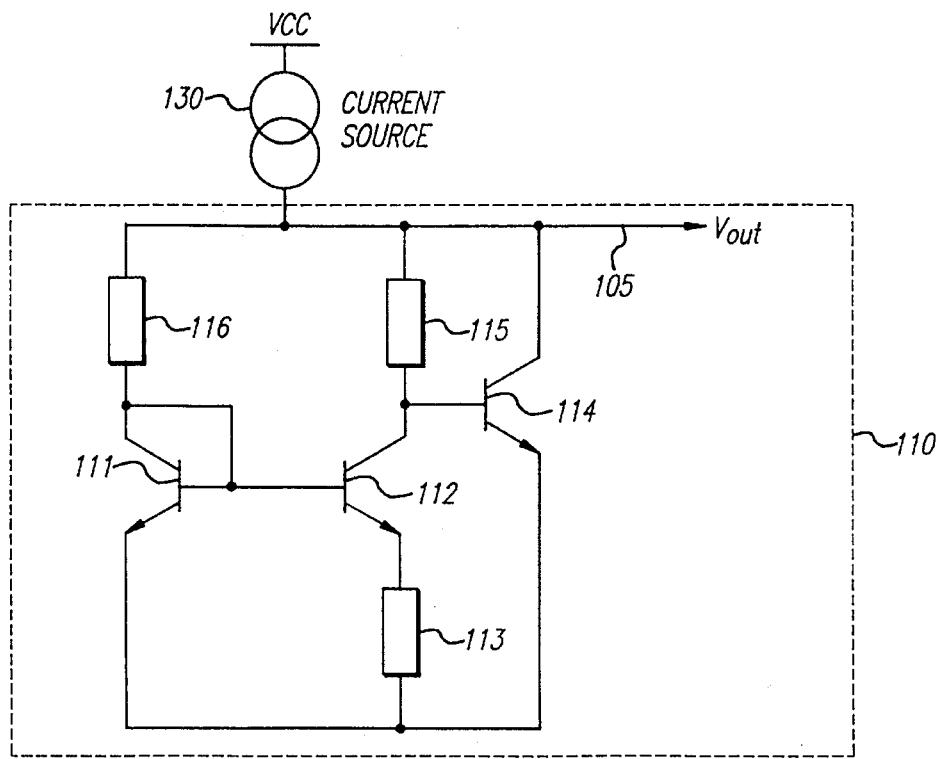
FIG. 9 is a detailed circuit diagram of an embodiment of the bandgap reference circuit incorporated within the thermal sensor.
Figure 10:
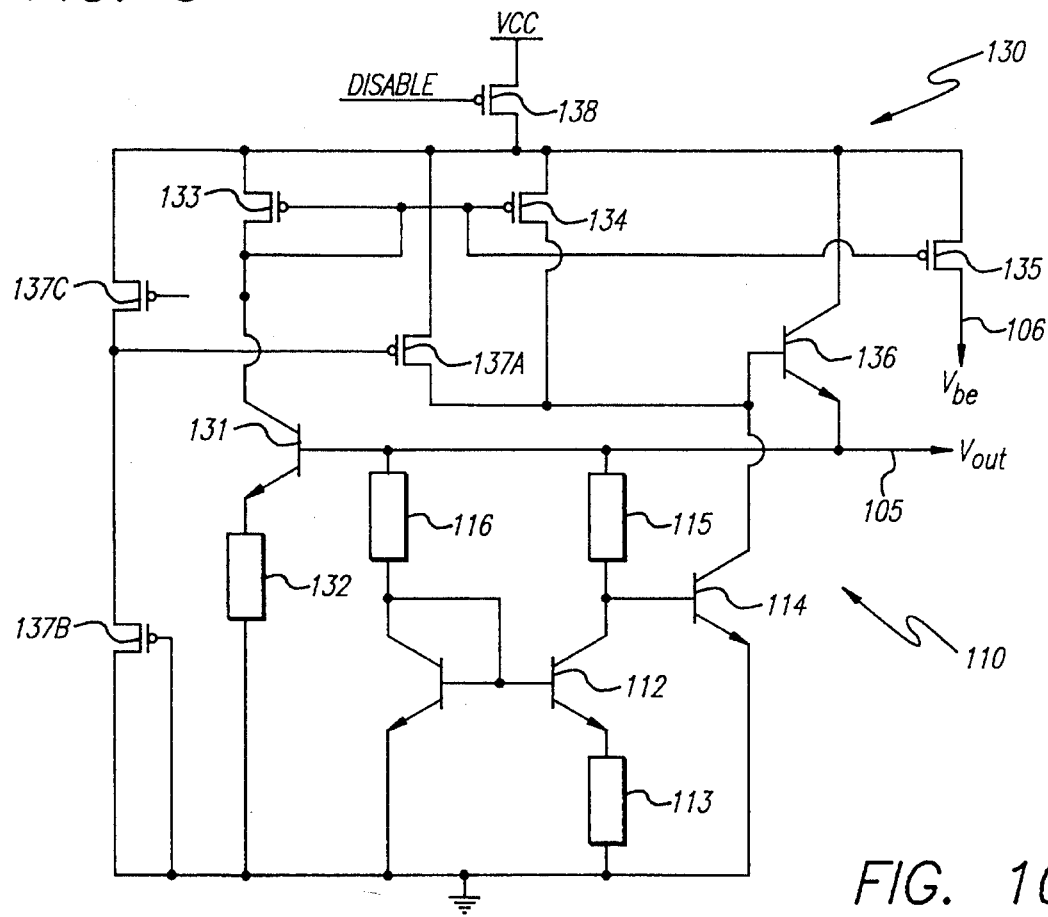
FIG. 10 is a detailed circuit diagram of an embodiment of a constant current source coupled to the bandgap reference circuit of FIG. 8.

Illustrated in FIG. 9, a constant current source 130 is needed to enable the thermal sensor 58 to be stable over $V_{cc}$ ranges since a fixed base current ("$i_b$") is constant. Thus, only $V_{be}$ varies with a change in temperature. The constant current source 130 is obtained by taking advantage of the constant voltage produced by the bandgap reference circuit 110. This current source 130 coupled to the bandgap reference circuit 110 are shown in FIG. 10.

A voltage at a base of a first source transistor 131 is held at $V_{out}$ maintaining a constant current through a third resistor 132. This constant current flows through a second source transistor 133 and is mirrored through a pair of third and fourth source transistors 134 and 135. The current source 130 then provides power to the bandgap reference circuit 110 through the third transistor 114 and a fifth source transistor 136. It should be noted that instead of the third transistor 114 being tied to $V_{out}$, it connects to a base of the fifth source transistor 136 which has been added as a gain stage. The fourth source transistor 135 provides a constant current source for the programmable $V_{be}$ circuit 120.

Since the bandgap reference voltage ("$V_{out}$") controls the current source 130 which, in turn, controls the bandgap reference circuit 110, some problems can occur. A first problem is ensuring start-up operations of the thermal sensor 58 when power is first applied. To ensure such start-up operations, transistors 137a–137c have been added. When $V_{cc}$ starts to increase from zero Volts, current is provided to the bandgap reference circuit 110 through the transistor 137a. As current starts to flow through the transistor 137a, it is mirrored through the transistor 137c so that the transistor 137a starts to turn off. Because of the voltage gain of the fifth source transistor 136, the current continues to build in the bandgap reference circuit 110 until the third transistor 114 starts to control the base of the fifth source transistor 116. A transistor 138 may be added to power down or disable the thermal sensor 58 for testing.

Figure 11:
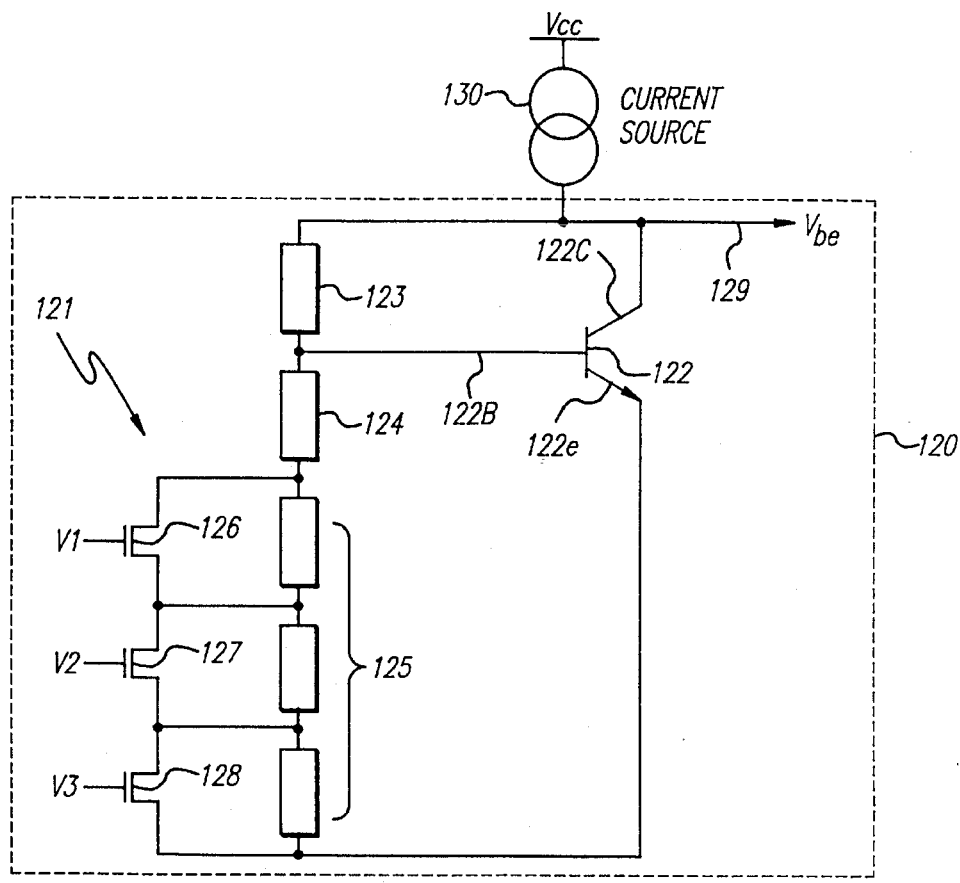
FIG. 11 is a detailed circuit diagram of an embodiment of the programmable $V_{be}$ circuit.

For the thermal sensor 58 to operate, not only is a stable $V_{out}$ needed, but also a temperature varying voltage is needed. This temperature varying voltage is produced by the programmable $V_{be}$ circuit 120 having a $V_{be}$ multiplier circuit 121 as shown in FIG. 11. The multiplier circuit 121 consists of a first multiplier transistor 122, a first multiplier resistor 123 and a second multiplier resistor 124 in series with a plurality of resistors (a "resistor series" 125). The resistor series 125 and the first multiplier resistor 123 are coupled to a base 122*b* of the first multiplier transistor 122 and emitter 122*e* of the first multiplier transistor 122, and therefore, influence the $V_{be}$ output voltage along signal line 129. Typically, the $V_{be}$ output voltage is equal to $V_{be}$ of the first multiplier transistor 122 plus a voltage drop across the first multiplier resistor 123. Current through the first multiplier resistor 123 is dependent on the resistive value of the resistor series 125 in which its resistive value depends on whether which of the selecting transistors 126–128 are activated (i.e., whether the resistor 125 is shorted) so as to change the current through the first multiplier resistor 123.

Referring back to FIG. 8, these signal lines are inputted into an on-chip logic gate 59 (e.g., an AND, OR, XOR, etc.), having at least one FAILURE signal line 60 which, however, operates as a select line for an on-chip multiplexor 61. It is contemplated that multiple lines may be necessary depending on the number of inputs into the on-chip multiplexor 61.

The multiplexor 61 includes multiple clock inputs 62 and 63 of varying frequencies, wherein a first clock input is a high clock signal having a clocking frequency equivalent to a maximum clock frequency supported by the processor 4 and a second clock input is a low clock signal having a clocking frequency less than the high clock signal. For example, the low clock signal may be the CLK signal operating at 33 MHz and the high clock signal may be operating at least twice the frequency of the CLK signal (e.g., between 80–100 MHz). It is contemplated, however, that a variety of clock signals with different frequencies could be inputted into the multiplexor 61, provided that at least the second clock signal has a sufficiently low frequency so that the fan/heatsink adequately dissipates heat generated by the processor even if the fan element is inoperative. If the FAILURE signal line 60 is active, the multiplexor 61 outputs the low clock signal into the core processor. It is further contemplated that the multiplexor 61 could have more than two inputs to support gradual performance reduction, thereby requiring the FAILURE signal to consist of multiple select lines as discussed above.

Figure 12:
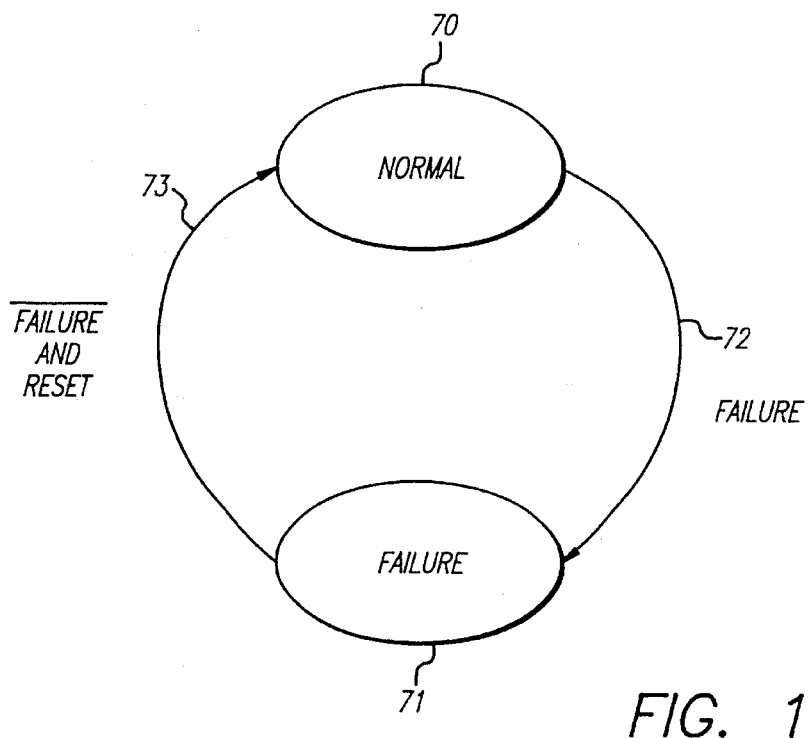
FIG. 12 is a state diagram of the operational states of the present invention.

As shown in FIG. 12, a state diagram of the operational structure of the present invention illustrates the desired characteristics of the present invention. The present invention has two states, namely a Normal state 111 and a Failure state 112. Each of these states has one state transition represented by arrows 113 and 114, which is the only possible transition in the next clock cycle from its respective state 111 and 112, respectively.

At power-up of the computer system, the present invention typically resides in the Normal state 111. In Normal state 111, the ICLK signal has a frequency equivalent to a maximum clock frequency. Once the FAILURE signal is activated and synchronized with the CLK signal, the present invention enters the Failure state 112. In the Failure state 112, the ICLK signal has a frequency equal to the CLK signal or any other predetermined multiple of the CLK signal, provided that the predetermined multiple of ICLK signal and sufficiently low so that thermal dissipation by an inoperative fan/heatsink is accomplished.

After entering the Failure state 112, the present invention cannot transition to the Normal state 111 unless a RESET signal is active and the FAILURE signal is inactive. The reason being that it is not desirable for the processor to oscillate between states in the event of an intermittent pulsing of the FAILURE signal. The RESET signal indicates that the computer system (and thus the processor) has disengaged operation, normally accomplished by turning off the computer allowing the fan to reset and the processor to cool.

A variety of methods may be used to detect and notify an end user of a fan failure condition, including but not limited to those discussed below for illustrative purposes. One such method is under software control through detection of a fan-fail bit within a Machine Check Type ("MCT") register. In order to perform this method, a driver to access the MCT register must be written for a particular operating system (e.g. DOS®, Windows®, OS/2®, UNIX®, etc.) of a computer system utilizing the semiconductor device with the fan/heatsink. Thereafter, an application is executed which makes a function call to the driver to access the fan-fail bit and return its value. Based on the returned value, the application then notifies the end user by displaying a message on the display device (e.g., a "print screen" instruction) or the like. This application may be run by the user or may run continuously, monitoring the fan fail bit.

Another method is to create a software program which estimates the speed of the semiconductor device by executing a loop having a few instructions and comparing its execution speed with its predetermined execution speed for normal operation at full speed. If the execution speed is below a certain percentage of the predetermined execution speed, the software program notifies the end user that performance has been reduced presumably due to a thermal error condition.

The present invention described herein may be designed in many different embodiments evident to one skilled in the art than those described without departing from the spirit and scope of the present invention. For example, although particular exemplary clock frequencies have been set forth, principles of the invention may be applied to systems employing different frequencies. The invention should, therefore be measured in terms of the claims which follow.

What is claimed is:

1. Employed within a semiconductor device having a fan element disposed thereon, an integrated circuit for reducing a clocking frequency of an internal clock signal used by core circuitry within the semiconductor device, said integrated circuit comprising:

multiplexing means for transmitting one of a plurality of input clock signals to said core circuitry as said internal clock signal, said plurality of input clock signals including at least a first input clock signal having a first clock frequency and a second input clock signal having a second clock frequency, wherein said first clock frequency is substantially greater than said second clock frequency; and logic means for selecting said internal clock signal, said logic means is coupled to said multiplexing means through a select line, wherein said logic means selects said first input clock signal to be said internal clock signal if said select line is inactive.

2. The integrated circuit according to claim 1, wherein said logic means activates said select line if said fan element experiences degradation in performance by a predetermined percentage.

3. The integrated circuit according to claim 2, wherein said logic means activates said select line if a thermal sensor coupled to said core circuitry indicates that said integrated circuit is operating at a temperature greater than a prescribed boundary temperature.

4. The integrated circuit according to claim 3, wherein said first clock frequency is at least twice said second clock frequency.

5. The integrated circuit according to claim 4, wherein said first clock frequency is 83.3 megahertz.

6. The integrated circuit according to claim 5, wherein said semiconductor device is a processor.

7. An integrated circuit for reducing a clocking frequency of an internal clock signal used by core circuitry within a semiconductor device including a fan element disposed thereon to dissipate heat from said semiconductor device, said integrated circuit comprising:
   a multiplexer for transmitting one of a plurality of input clock signals to be said internal clock signal, said plurality of input clock signals including at least a first input clock signal having a first clock frequency and a second input clock signal having a second clock frequency, wherein said first clock frequency is substantially greater than said second clock frequency; and
   at least one logic gate for selecting said internal clock signal, said logic gate is coupled to said multiplexer through a select line, wherein said logic gate activates said select line to select said first input clock signal to be said internal clock signal if said fan element experiences degradation in performance by a predetermined percentage.

8. The integrated circuit according to claim 7, wherein said logic means activates said select line if a thermal sensor coupled to said core circuitry indicates that said integrated circuit is operating at a temperature greater than a prescribed boundary temperature.

9. The integrated circuit according to claim 8, wherein said first clock frequency is approximately equal to at least twice said second clock frequency.

10. A computer system comprising:
    means for storing information;
    processing means for processing said information, said processing means includes
    (i) core circuitry for processing said information, and
    (ii) an integrated circuit for reducing a clocking frequency of an internal clock signal used by said core circuitry within said processing means, said integrated circuit includes
       (a) multiplexing means for transmitting one of a plurality of input clock signals to be said internal clock signal, said plurality of input clock signals including at least a first input clock signal having a first clock frequency and a second input clock signal having a second clock frequency, wherein said first clock frequency is substantially greater than said second clock frequency, and
       (b) logic means for selecting said internal clock signal, said logic means is coupled to said multiplexing means through a select line, wherein said logic means selects said first input clock signal to be said internal clock signal if said select line is inactive; and
    (iii) bus means, coupled to said storing means and said processing means, for enabling communication between said storing means and said processing means.

11. The integrated circuit according to claim 10, wherein said logic means activates said select line if said fan element experiences degradation in performance by a predetermined percentage.

12. The integrated circuit according to claim 11, wherein said logic means activates said select line if a thermal sensor coupled to said core circuitry indicates that said integrated circuit is operating at a temperature greater than a prescribed boundary temperature.

13. The integrated circuit according to claim 12, wherein said first clock frequency is approximately equal to at least twice said second clock frequency.

14. A computer system comprising:
    a first semiconductor device;
    a second semiconductor device having a fan element disposed thereon, said second semiconductor device including:
    (i) core circuitry for processing said information, and
    (ii) an integrated circuit for reducing a clocking frequency of an internal clock signal used internally by said second semiconductor device, said integrated circuit includes
       a multiplexer for transmitting one of a plurality of input clock signals to be said internal clock signal, said plurality of input clock signals including at least a first input clock signal having a first clock frequency and a second input clock signal having a second clock frequency, wherein said first clock frequency is substantially greater than said second clock frequency, and
       at least one logic gate for selecting said internal clock signal, said logic gate is coupled to said multiplexer through a select line, wherein said logic gate activates said select line to select said first input clock signal to be said internal clock signal if said fan element experiences degradation in performance by a predetermined percentage from normal performance by said fan element; and
    a bus, coupled to said first semiconductor device and said second semiconductor device, for enabling communication between said first and second semiconductor devices.

15. The computer system according to claim 14, wherein said second semiconductor device is a processor including core circuitry clocked by said internal clock signal.

16. The computer system according to claim 15, wherein said logic gate activates said select line if a thermal sensor coupled to said core circuitry indicates that said integrated circuit is operating at a temperature greater than a prescribed boundary temperature.

17. The computer system according to claim 16, wherein said first clock frequency is approximately equal to at least twice said second clock frequency.

18. A method for detecting and reducing an internal clocking frequency of a semiconductor device having a fan element disposed thereon, said method comprising the steps of:
    determining whether a first condition exists, said first condition being that said fan element is experiencing degradation in performance by a predetermined percentage from a normal performance level;
    determining whether a second condition exists, said second condition being that said semiconductor device is operating at a temperature greater than a prescribed boundary temperature; and
    reducing said internal clocking frequency of said semiconductor device if at least one of said first and second conditions exist.

19. The method according to claim 18, wherein said semiconductor device is adapted for use in a computer system having a predetermined operating system.

20. The method according to claim 19 further comprising the step of notifying a user of the computer system that the semiconductor device is operating at a frequency less than said internal clocking frequency, provided an execution speed of the semiconductor device is less than a minimal threshold execution speed.

21. The method according to claim 19 further comprising the step of notifying a user of the computer system that at least said first condition exists if a software driver, coded for predetermined operating system of the computer system, detects an asserted fan-fail bit of a predetermined register.

22. An apparatus comprising:

a fan element, mounted onto a semiconductor device, to produce airflow to thermally cool said semiconductor device; and said semiconductor device including an integrated circuit to reduce power consumption of said semiconductor device upon detecting said fan element is experiencing unacceptable devaluation in performance.

* * * * *

UNITED STATES PATENT AND TRADEMARK OFFICE
CERTIFICATE OF CORRECTION

PATENT NO.   : 5,483,102
DATED        : January 9, 1996
INVENTOR(S)  : Neal et al.

It is certified that error appears in the above-identified patent and that said Letters Patent is hereby corrected as shown below:

In column 3 at line 52 delete "dock" and insert --clock--

Signed and Sealed this

Thirty-first Day of December, 1996

Attest:

BRUCE LEHMAN

*Attesting Officer*         *Commissioner of Patents and Trademarks*